Figure 1:
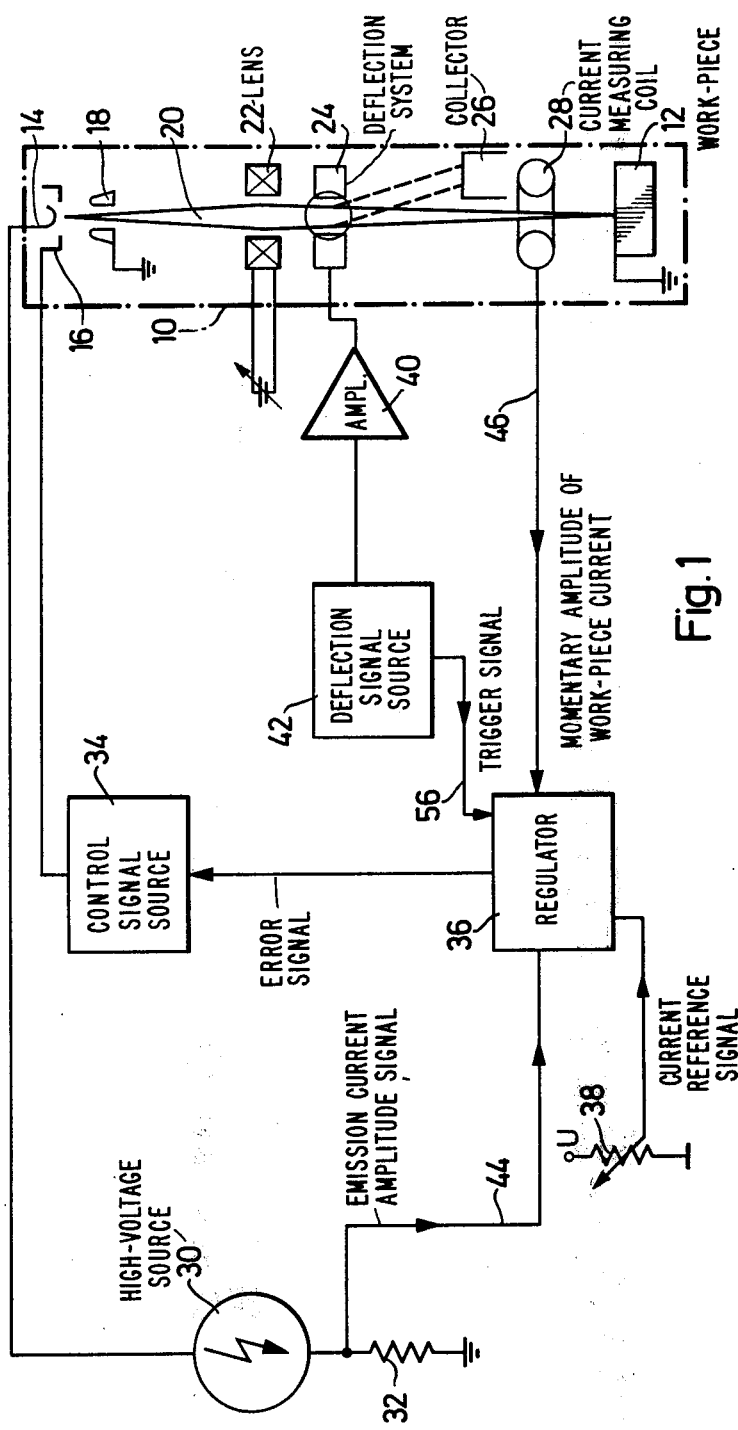

United States Patent [19]

von Walter

[11] 4,021,636

[45] May 3, 1977

[54] BEAM CURRENT CONTROL DEVICE FOR A TECHNICAL CORPUSCULAR BEAM APPARATUS

[75] Inventor: Alfred von Walter, Munich, Germany

[73] Assignee: Steigerwald Strahltechnik GmbH, Munich, Germany

[22] Filed: Oct. 28, 1975

[21] Appl. No.: 626,224

[30] Foreign Application Priority Data

Oct. 29, 1974 Germany ............... 2451366

[52] U.S. Cl. ........................... 219/121 EB
[51] Int. Cl.² ........................... B23K 9/00
[58] Field of Search ............ 219/121 EM, 121 EB; 315/8.5, 84.5, 105, 158, 199, 301, 307, 308, 84.4

[56] References Cited

UNITED STATES PATENTS

| | | | |
|---|---|---|---|
| 3,479,483 | 11/1969 | Boring et al. | 219/121 EB |
| 3,547,074 | 12/1970 | Hirschfeld | 219/121 EB X |
| 3,838,313 | 9/1974 | Anderson | 219/121 EB X |
| 3,875,366 | 4/1975 | von Walter | 219/121 EM |

*Primary Examiner*—Bruce A. Reynolds
*Assistant Examiner*—Mark Paschall
*Attorney, Agent, or Firm*—Flynn & Frishauf

[57] ABSTRACT

A beam current control device in a technical corpuscular beam apparatus for welding, cutting, boring, melting, hardening and like operations, wherein a corpuscular beam emitted by a beam gun is switched between an active position in which it impinges on the work-piece and a rest position in which at least its major portion does not impinge on the work-piece, comprises means for measuring the gun emission current, means for measuring the beam current impinging on the work-piece when the beam is switched from said rest into said active position, means for forming a quotient signal corresponding to the quotient of said emission current and said beam current, means for producing a reference signal, means for deriving an error signal from said quotient and reference signals, and control means responsive to said error signal to control said emission current in a sense to minimize said error signal.

4 Claims, 3 Drawing Figures

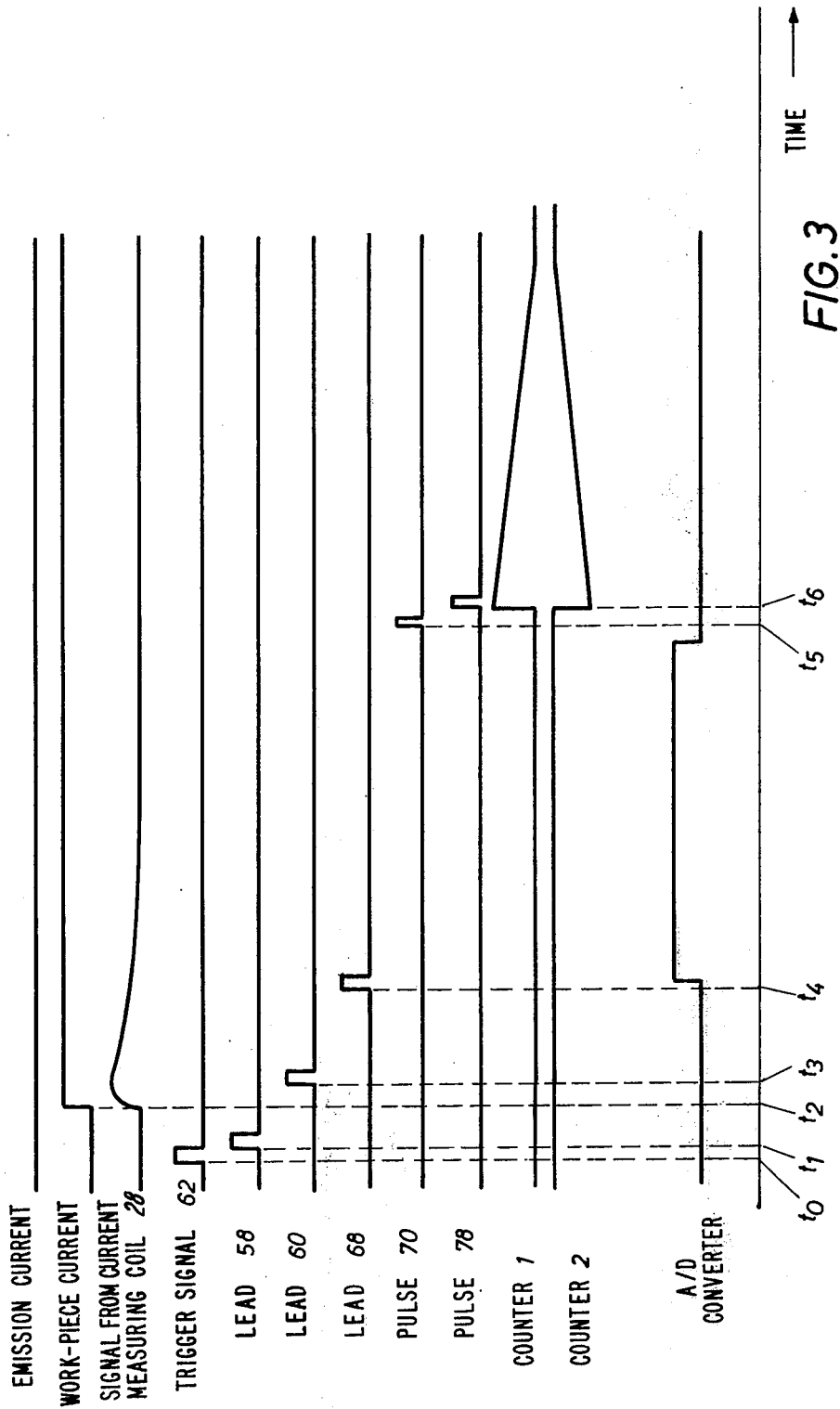

BEAM CURRENT CONTROL DEVICE FOR A TECHNICAL CORPUSCULAR BEAM APPARATUS

The present invention concerns an electrically charged corpuscular beam apparatus for machining work pieces, said apparatus comprising a beam gun which includes a source of charge carriers (e.g. electrons or ions) forming said corpuscular beam; a device for switching on and off the corpuscular beam which impinges on the work piece, a measuring device to determine the magnitude of the current of the corpuscular beam (work-piece current) impinging on the work piece at the time at which it is switched on, and a control device to control the magnitude of the current of the corpuscular beam produced by the beam gun.

A current control for a pulse-operated corpuscular beam apparatus is known from U.S. Pat. No. 3,875,366 by the inventor here of where said device the maximum value of the workpiece current, measured during each pulse, is stored and is used as the beam actual value for the control of the magnitude of the beam current of a following corpuscular beam pulse. The beam current in a corpuscular beam apparatus used in engineering applications is usually controlled by means of the potential of a control electrode (Wehnelt cylinder) in the beam gun.

Current control or regulating devices of this type have proved satisfactory for charge-carrier beam apparatus operating with periodic charge-carrier beam pulses. With irregular series of pulses and long pauses between pulses difficulties may however arise since in that case the actual value of the beam current measured earlier is not necessarily representative of the beam which is later controlled on the basis of said actual value.

Corpuscular beam apparatus for engineering or machining use are however also known in which the beam gun produces a continuous corpuscular, e.g. electron beam and the work-piece current can be controlled by deflecting the beam from an active working position in which it impinges on the work piece and a rest position in which it strikes a beam collector.

The basic object of the present invention is to provide a beam current control device for a corpuscular beam apparatus of the last-named type which permits the control of the beam current even when the beam is switched on and off (in respect to the work piece) at irregular and relatively long intervals.

The invention may be embodied in a device for controlling the beam current in a technical charged corpuscular (i.e. electron or ion) beam apparatus for working on work pieces, comprising a beam gun which includes a source of charge-carrier current which emits the charge-carriers, means for switching on and interrupting the beam striking the work piece, measuring means for determining the current strength of the charge-carrying beam striking the work piece ("work-piece current") and control means for controlling the current-strength of the corpuscular beam emitted by the beam-producing system in which the switching-on and interruption of the corpuscular beam striking the work piece takes place be deflecting it from a working position in which it strikes the work piece into a rest position in which it strikes a collector.

SUBJECT MATTTER OF THE INVENTION

The device includes second measuring means for the continuous determination of the emission current of the carrier-source; and storage means for the formation and storage of a quotient signal from the values of the emission current and the work-piece current during switching-on of the latter; multiplier means for the continuous formation of a product signal from the stored quotient signal and the continuously produced emission current actual value signal; and means for comparing the product signal with a desired work-piece current signal with the production of an error signal which is conveyed to the control device causing it to operate in the sense of a reduction in the error signal.

The present invention makes possible continuous control of the beam current even when the work-piece current is interrupted by the deflection of the corpuscular beam for relatively long periods of time, for example of the order of minutes. In particular the control eliminates the effect of alterations of the parameters of the gun or source of the charge-carrier or corpuscular beam.

Figure 2:
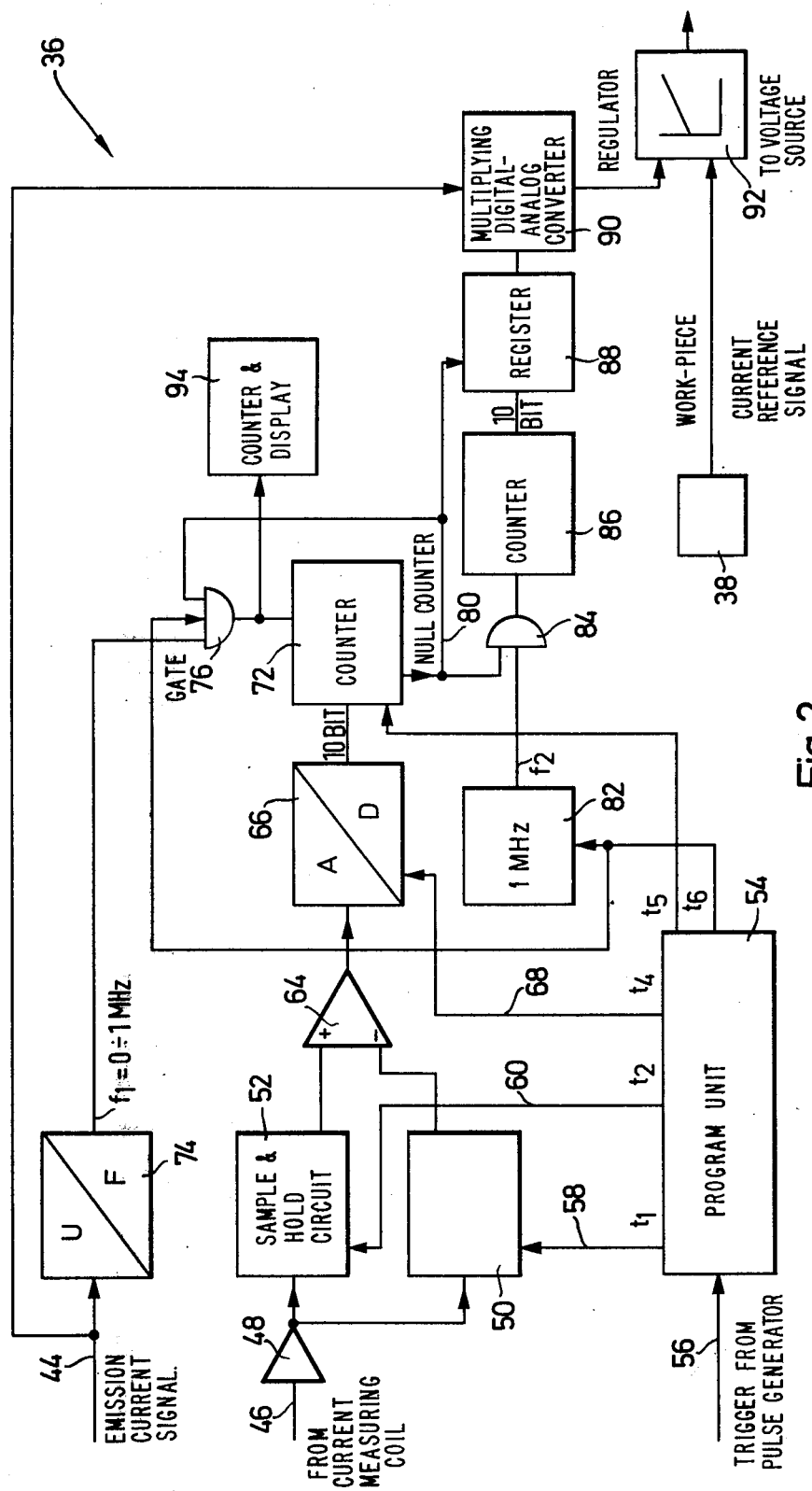

A non-limiting embodiment of the invention is described in more detail in the following with reference to the drawing which shows:

FIG. 1: a schematic representation of a charged corpuscular beam apparatus with a block diagram of a control device according to an example of embodiment of the invention;

FIG. 2: a block diagram of an example of an embodiment of a regulator for the control device according to FIG. 1, and FIG. 3: a graphical representation of the time curve of signals as they are produced during operation of the device of FIGS. 1 and 2.

The technical corpuscular beam apparatus for working-on work pieces, shown schematically in FIG. 1, is an electron beam apparatus 10 ("EB-apparatus") which is used to work on a work piece 12 in a known manner, such as, for example, by boring, cutting, welding or the like.

The electron beam apparatus includes an electron gun comprising a cathode 14, a control electrode 16 (Wehnelt cylinder) and an anode 18.

The gun 14-16-18 produces an electron beam 20 which is focussed by a magnetic lens 22 on the work piece 12 and which can be deflected by means of a magnetic deflection system 24 between an undeflected active or working position in which it strikes the work piece 12 and a deflected rest position, shown in broken lines, in which it strikes a collector 26.

Between the deflection system 24 and the work piece 12 there is arranged a current measuring coil 28, usually designed as a toroidal coil, in which a current pulse is induced when the electron beam is deflected from the rest position into the working position, the maximum value of said current pulse being proportional to the actual value of the current intensity of the electron beam 20 striking the work piece in its working position.

The cathode 14 is connected to the negative terminal of a high-voltage source 30, which provides a d.c. potential of the order of for example 100 kV ground. The positive pole of the high-voltage source is grounded through a current sampling resistor 32. The work piece 12 and the collector 26 are also grounded. The control electrode 16 is supplied with a control potential by a control signal source 34. The control potential is usually negative with respect to the cathode potential. The control signal produced by the source 34 can be controlled by a regulator 36, which is connected to a source 38 of a signal of the desired current value (current reference signal), which may be constant or varying in accordance with a predetermined program.

The deflection system 24 is connected through an amplifier 40 to a source 42 of a deflection signal. The pulse of current produced in the current measuring coil 28 when the work-piece current is switched on, and thus when the electron beam 20 is deflected from the rest position into the working position, is led to the regulator 36 and there acts as a measure of the actual value of the work-piece current at the moment of switching-on.

As far as already described the device is known in principle.

According to the invention, a signal representing the actual value of the emission current produced by the current measuring resistance 32, or in another manner, is additionally conducted to the regulator 36 by a lead 44. When the work piece current is switched on under the control of a trigger signal from the deflection signal source 42, the regulator 36 forms the quotient of the momentary value of the actual value of the work-piece current (as measured by the coil 28) and the momentary actual value of the emission current (as measured e.g. by the voltage drop across current sampling resistor 32). This quotient will be termed "beam current efficiency" and represents the fraction of the values of the emission current and of the current which strikes the work piece in the working position of the electron beam. It has been discovered that the beam current efficiency of a corpuscular beam apparatus is substantially constant, so that the actual value of the work-piece current, which because of its inductive measurement by the current-measuring coil 28 can only be determined at the moment of switching-on, can also be determined with good accuracy at later times after switching-on by multiplying the emission current by the beam current efficiency. The regulator thus includes means to produce a beam current efficiency signal from the momentary values of the work-piece current and the emission current when the work piece current is switched on, as well as means for the continuous generation of the product of the actual value of the emission current and the beam current efficiency determined when switching-on. This product remains available during the whole period during which the electron beam is switched on and is used in the regulator 36 as a continuous signal of the actual value of the work-piece current with which the desired current value or reference signal is compared and which is used in the usual manner to provide an error signal which controls the source of control potential 34 in the sense a decrease the error signal.

FIG. 2 shows a digitally operating embodiment of the regulator 36 the manner of operation of which will be described in detail in the following with reference to FIG. 3:

The work-piece current actual value signal led by lead 46 from the current measuring coil 28 is amplified by an amplifier 48 and coupled to two sample and hold circuits 50 and 52. The point of time of sampling is in each case determined by a time control circuit 54 to which the trigger signal from the deflection signal source 42 is coupled by a lead 56 and which, for its part, is connected by the leads 58 and 60 to the sample and hold circuits 50 and 52.

The deflection signal source 42 produces a trigger signal 62 of pulse form to the time control circuit 54 at the point of time $t_0$. This trigger signal activates the sample and hold circuit 50 at a point of time $t_1$ lying closely before the switching-on of the work-piece current at the point of time $t_2$ so as to store the rest value of the work-piece current therein. At a point of time $t_3$ the time control circuit 54 activates the sample and hold circuit 52 through the lead 60 so that the actual value of the work-piece current at the moment of switching-on is stored in said circuit. The current-measuring coil 28 is certainly only able to transmit an abrupt change of current faithfully. Because of the time constant of this coil due to its inductance and internal resistance the coil current does not rise exactly perpendicularly and, after passing through a maximum value, it decreases exponentially as is shown in FIG. 3 in the third curve from the top. The point of time $t_3$ is conveniently so situtated as to coincide with the maximum of the current-measuring coil signal.

The signals stored in the sample and hold circuits 50 and 52 are coupled to the inputs of a differential amplifier 64, which subtracts the rest value of the work-piece current produced in the sample hold circuit 50 from the specific actual work-piece current value signal produced in the sample and hold circuit 52. The difference signal produced thus is coupled to a signal input of an analogue/digital converter 66. At the point of time $t_4$, the digital/analogue-converter, under the control of a strobing pulse 68 from the time control circuit 54, accepts the difference signal from the differential amplifier 64 and converts it to a 10-bit-word, which is conveyed in parallel to a counter 72 under the control of a strobing pulse 70 at the point of time $t_5$.

The actual value of the emission current signal fed continuously through the lead 44 is converted to a frequency $f_1$, proportional to the potential difference in a voltage to frequency converter 74 which said frequency $f_1$ may, for example, lie in the range between 0 and 1 MHz. The output of the converter 74 is coupled through a gate circuit 76 to a reverse-counting input of the counter 72. The gate circuit 76 is activated by a pulse 78 appearing at a point of time $t_6$, and is again blocked by a blocking pulse supplied through a lead 80 which is produced by the counter 72 when it reaches the count value 0. The pulse 78 is produced at a point of time $t_6$ which is preferably synchronised with the frequency $f_1$ of the voltage to frequency converter 74 so as to produce the greatest possible accuracy. The pulse 78 also activates a fixed frequency generator 82 which may for example be a multivibrator and which supplies a fixed frequency signal $f_2$ of for example 1 MHz through a gate circuit 84 to a second counter 86. The gate circuit 84 is controlled by the blocking signal in the lead 80 and remains open as long as the counter 72 contains a count value greater than 0.

The time T required by the counter 72 to count back to 0 from its initial count value determined by the output signal of the voltage to frequency converter 74 is proportional to the work-piece current $I_w$ measured at the point of time $t_3$ and inversely proportional to the frequency $f_1$. It is thus given by the equation:

$$T = \frac{I_w}{F_1} = \frac{I_w}{I_E}$$

where $I_E$ is the emission current.

Under the control of the gate circuit 84 the counter 86 counts a number of periods of the frequency $f_2$ signal generated by the fixed frequency generator 82 corresponding to the time T and the count value obtained this way which has the form of a 10-bit-word is accepted by a register 88 under the control of the control pulse from the counter 72. This digital value in the register 88 is proportional to the beam current efficiency $W = I_w/I_E$ and is coupled to a multiplying digital to analogue converter 90 as one factor signal. The other factor signal consists of the actual value emission current signal introduced through the lead 44. The output signal of the digital to analoge converter 90 is the analogue actual work-piece current value signal calculated on the basis of the efficiency of the beam current, assumed to be constant, which remains available during the whole period during which the work-piece current is switched on, said output signal is led to a proportional integral (PI) regulator or control device 92. The PI-control device 92 also receives a reference signal from the desired current value source 38. The desired current value or reference signal may be constant or may follow a course determined by a program control or the like.

The PI-control device gives a control signal to the control signal source 34 which changes the control potential in the sense of a decrease in the difference between the desired work-piece current value and the actual work-piece current value.

The closed loop control circuit provided in this way has a regulation time constant which is determined at its lower limit practically only by the time constant of the control potential adjustment, and can thus be reduced without difficulty to about 10 to 100 milliseconds. The control time constant is, on the other hand, independent of the frequency of the measuring signal provided by the current measuring coil 28. In practice the beam current efficiency W defined above, changes during the heating-up phase of a conventional beam gun, normally lasting about 1.5 hours, only by about 10%, while the emission current may change by a factor of 2 or more. Thus neither a control based only on the actual value of the emission current nor a control based only on the actual value of the work-piece current at the point of time at which it was switched on is able to produce the accuracy and the short control time constant of the present control device. In the present device an accuracy of control up to $10^{-3}$ can be achieved without special difficulty.

Instead of the digital circuit arrangement described with reference to FIGS. 2 and 3 it is of course possible to use other digital and/or analogue control circuits capable of performing the functions as explained in the introduction.

A third counter 94 (FIG. 1) having a numerical display may be coupled to the signal output of the first gating circuit 76 to display the actual value of the emission current.

The invention is not limited to the specific embodiment described above.

What is claimed is:

1. A device for controlling the beam current in charged corpuscular beam apparatus for working on work pieces, comprising a beam gun having deflection means and a source which emits charge-carriers, to result in a charge carrier current;
   means for switching on and interrupting the beam striking the work piece;
   first measuring means for determining the work piece current as a measure of the current intensity of the corpuscular beam striking the work piece;
   control means for controlling the magnitude of the current of the corpuscular beam emitted by said gun;
   said switching-on and interruption of the corpuscular beam striking the work piece being effected by said deflection means deflecting said beam from a working position in which it strikes the work piece into a rest position in which it strikes a collector device,
   and comprising, in accordance with the invention,
   second measuring means for the continuous determination of the emission current of the carrier-source;
   dividing and storage means connected to and controlled by said first and second measuring means for producing and storing of a quotient signal from the values of the emission current and the work-piece current during switching-on of the latter;
   multiplier means for the continuous formation of a product signal from the stored quotient signal and the continuously produced emission current actual value signal;
   means providing a reference signal to control the charge carrier current;
   means for comparing the product signal with a reference signal and providing an error signal;
   and means conveying said error signal to said control means causing it to operate in the sense of a reduction in the error signal.

2. Device according to claim 1, further comprising means for producing a corrected work-piece actual current signal representing the work-piece current at the time of its switching-on by the substraction of work-piece current actual value signal measured shortly before switching-on the work-piece current from a work-piece actual value signal measured shortly after switching-on the work-piece current.

3. Device according to claim 2, further comprising first and second sample and hold circuits;
   means coupling the inputs thereof to said work-piece current measuring means;
   time control means for providing a strobe pulse to the first sample and hold circuit shortly before the switching-on of the work-piece current, and a strobe pulse to the second scanning and storage circuit shortly after switching-on the work piece current;
   differential amplifier means having a subtracting and a summing input, which is coupled with the output of the first and second sample and hold circuit respectively;
   an analogue to digital converter controlled by the time control means to produce a digital value proportional to the output signal of the differential amplifier;
   a first counter in which the digital value produced by the analogue to digital transducer can be stored under the control of the time control circuit and which produces a blocking signal when its numerical value is 0 or less than 0;

a voltage to frequency converter whose input is coupled with the emission current measuring means and whose output delivers a signal with a frequency proportional to the actual value of the emission current;

a gate circuit with a signal input coupled with the output of the voltage to frequency converter, a signal output coupled with a reverse-count input of said counter, a gating input which is coupled with the time control means and a blocking input to which the blocking signal from said first counter is conducted;

a constant frequency generator which delivers a signal at a constant frequency ($f_2$) to a signal input of a second gating circuit which has a signal output and which can be blocked by a blocking signal applied to a blocking input from said first counter;

a second counter coupled with the signal output of the second gating circuit for counting the periods of the output signal of the constant frequency generator during the time in which the first counter counts down to 0 from the initial value stored in it, under the control of the output signal of the potential to frequency converter;

storage means coupled with the output of the second counter which stores the number contained in the second counter on the arrival of the blocking signal from the first counter;

a multiplier circuit having two factor inputs one of which is coupled with the emission current measuring apparatus and the other with the output of the storage circuit and an output which delivers a signal which is the product of the emission current actual value and the numerical value stored in the storage unit; and control means with a reference value and an actual value input to which a work-piece current desired value signal and the output signal of the multiplier circuit (90) respectively, is led and which controls the emission current in the sense of a decrease in the difference between the signals led to its inputs.

4. Device according to claim 3, further comprising a third counter having a numerical display device coupled to the signal output of the first gating circuit.

* * * * *